United States Patent
Nomura et al.

(10) Patent No.: US 7,315,076 B2
(45) Date of Patent: Jan. 1, 2008

(54) DISPLAY DEVICE AND MANUFACTURING METHOD OF THE SAME

(75) Inventors: Hideshi Nomura, Togage (JP);
Masahiro Tanaka, Chiba (JP);
Takahiro Ochiai, Chiba (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 86 days.

(21) Appl. No.: 10/862,631

(22) Filed: Jun. 8, 2004

(65) Prior Publication Data

US 2004/0256619 A1    Dec. 23, 2004

(30) Foreign Application Priority Data

Jun. 18, 2003    (JP) .............................. 2003-173062

(51) Int. Cl.
*H01L 23/58* (2006.01)

(52) U.S. Cl. .................. 257/640; 257/637; 438/724

(58) Field of Classification Search ................ 257/637, 257/640; 438/724
See application file for complete search history.

(56) References Cited

U.S. PATENT DOCUMENTS 5,962,916 A    10/1999    Nakanishi et al.
6,265,247 B1   7/2001    Nakanishi et al.
6,396,078 B1   5/2002    Uochi et al.
6,593,235 B2   7/2003    Uochi et al.

FOREIGN PATENT DOCUMENTS

| JP | 09-251996  | 9/1997 |
| JP | 11-111990  | 4/1999 |
| JP | 11-258634  | 9/1999 |

*Primary Examiner*—Doug Menz
(74) *Attorney, Agent, or Firm*—Antonelli, Terry, Stout & Kraus, LLP.

(57) ABSTRACT

A display device is provided in which contact holes, each having a sidewall with an ideal tapered shape, are formed in a structure in which a silicon oxide film, a silicon nitride film and a silicon oxide film are stacked in the named order. The display device includes a first silicon oxide film, a silicon nitride film stacked on the first silicon oxide film, a second silicon oxide film stacked on the silicon nitride film, and a contact hole which extends through at least these three layers. In the display device, letting d2 and d3 denote, respectively, a film thickness of the silicon nitride film and a film thickness of the second silicon oxide film, these films are stacked to satisfy the relationship d2<d3, and the contact hole is formed to have a tapered shape free of constrictions.

15 Claims, 3 Drawing Sheets

DISPLAY DEVICE AND MANUFACTURING METHOD OF THE SAME

The present application claims priority from Japanese application JP2003-173062, filed on Jun. 18, 2003, the content of which is hereby incorporated by reference into this application.

BACKGROUND OF THE INVENTION

The present invention relates to display devices, and, more specifically, the invention relates to display devices, such as an active matrix type of liquid crystal display device.

An active matrix type of liquid crystal display device includes a plurality of gate signal lines disposed so as to extend in the x direction and to be juxtaposed in the y direction and a plurality of drain signal lines disposed so as to extend in the y direction and to be juxtaposed in the x direction; and, these gate and drain signal lines are formed on a liquid-crystal-side surface of one of a pair of substrates disposed in opposition to each other with a liquid crystal interposed therebetween. Areas each surrounded by adjacent ones of the gate signal lines and adjacent ones of the drain signal lines are formed as pixel areas, and an array of these pixel areas is constructed as a liquid crystal display part.

Each of the pixel areas includes a thin film transistor to be driven by a scanning signal received from a gate signal line formed on one side of the pixel area, and a pixel electrode to be supplied with a video signal via this thin film transistor from a drain signal line formed on another side of the pixel area.

This pixel electrode causes an electric field to be generated between the pixel electrode and a counter electrode formed on a liquid-crystal-side surface of either of the substrates, and the optical transmissivity of the liquid crystal of the corresponding pixel areas is controlled by the intensity of the electric field.

The above-mentioned signal lines, thin film transistors, electrodes and the like are micromachined by selectively etching stacked conductive layers, an insulating layer, a semiconductor layer or the like by so-called photolithography techniques.

In this case, it is common practice that the conductive layers formed as different layers separated by the insulating film are electrically connected to each other through a contact hole formed in the insulating film. However, if the insulating film is made of multiple layers, it is difficult to form the sidewall of the contact hole into a smooth shape, because of the difference in etching rate, film thickness or the like between the multiple layers, and techniques to overcome this difficulty need to be introduced. This is because, in the case where a connection is provided between the conductive layers through the contact hole, a disconnection is easily created in a conductive layer formed to reach the sidewall.

As one example, there is a known technique which is applicable to a thin film transistor having a so-called top gate structure in which tapering of contact holes is performed for forming electrodes of the thin film transistor, by wet etching, when the contact holes are formed in a structure in which a silicon oxide film, a silicon nitride film and a silicon oxide film are stacked in the named order (refer to Patent Document 1).

As another example, there is a known technique in which the materials of multiple insulating films which form a contact hole are individually selected, so that the etching rates of the respective insulating films increase stepwise or continuously from the bottom layer toward the top layer (refer to Patent Document 2).

As yet another example, there is a known technique in which contact holes are formed in a stacked structure made of a silicon oxide film and a silicon nitride film through one etching process (refer to Patent Document 3).

Patent Document 1 is JP-A-11-111990.

Patent Document 2 is JP-A-9-251996.

Patent Document 3 is JP-A-11-258634.

SUMMARY OF THE INVENTION

However, in the case of the technique described in Patent Document 1, since the silicon nitride film formed as an intermediate layer of the multiple insulating films is formed to have a comparatively large film thickness, the sidewall surfaces of the contact holes are not formed into ideal tapered shapes, so that there is still much room for improvement.

In the case of the technique described in Patent Document 2, since the kinds of materials of the multiple insulating films are restricted, there is the disadvantage that a case may occur where some of the materials are inappropriate in the formation of pixels of a display device.

In the case of the technique described in Patent Document 3, since the technique is limited to the case where contact holes are formed in a stacked structure made of a silicon oxide film and a silicon nitride film which satisfy particular conditions, there is the disadvantage that a case may occur where this limitation becomes inappropriate in the formation of pixels of a display device.

The invention provides a display device in which contact holes, each having a sidewall with an ideal tapered shape, are formed in a structure in which a silicon oxide film, a silicon nitride film and a silicon oxide film are stacked in the named order.

Representative aspects of the invention disclosed in the present application will be described below in brief as particular examples.

(1) A display device according to the invention, as one example, includes: a first silicon oxide film; a silicon nitride film stacked on the first silicon oxide film; a second silicon oxide film stacked on the silicon nitride film; and a contact hole extended through at least three layers which include the first silicon oxide film, the silicon nitride film and the second silicon oxide film. Letting $d2$ and $d3$ denote, respectively, a film thickness of the silicon nitride film and a film thickness of the second silicon oxide film, the silicon nitride film and the second silicon oxide film are stacked to satisfy the relationship $d2<d3$, and the contact hole is formed to have a tapered shape free of constrictions.

(2) In a display device according to the invention, which is based on, for example, the construction mentioned above in Example (1), letting $\theta1$, $\theta2$ and $\theta3$ denote, respectively, a taper angle of the first silicon oxide film, a taper angle of the silicon nitride film and a taper angle of the second silicon oxide film, the contact hole is formed to satisfy the relationships $\theta2<\theta1<90°$ and $\theta2<\theta3<90°$.

(3) In a display device according to the invention, which is based on, for example, the construction mentioned above in Examples (1) or (2), letting $Er1$, $Er2$ and $Er3$ denote, respectively, an etching rate of the first silicon oxide film, an etching rate of the silicon nitride film and an etching rate of the second silicon oxide film, the etching rates are selected to satisfy the relationships $Er1<Er3$, $Er2<Er3$ and $Er2<Er1$.

(4) In a display device according to the invention, which is based on, for example, the construction mentioned above in Examples (1) or (2), letting Er1, Er2 and Er3 denote, respectively, an etching rate of the first silicon oxide film, an etching rate of the silicon nitride film and an etching rate of the second silicon oxide film, the etching rates are selected to satisfy the relationships $Er1 \geq Er3$, $Er2<Er3$ and $Er2<Er1$.

(5) In a display device according to the invention, which is based on, for example, the construction mentioned above in any of Examples 1 to 4, the contact hole is formed by collectively wet-etching the first silicon oxide film, the silicon nitride film and the second silicon oxide film.

(6) In a display device according to the invention, which is based on, for example, the construction mentioned above in any of Examples 1 to 5, the first silicon oxide film is a gate insulating film of a thin film transistor, the silicon nitride film and the second silicon oxide film are interlayer insulating films, and the contact hole is formed over each of the source and drain regions of the thin film transistor.

(7) A method of manufacture of a display device according to the invention is, for example, for manufacture of a display device which includes a first silicon oxide film, a silicon nitride film stacked on the first silicon oxide film, a second silicon oxide film stacked on the silicon nitride film, and a contact hole extended through at least three layers which include the first silicon oxide film, the silicon nitride film and the second silicon oxide film, and letting d2 and d3 denote, respectively, a film thickness of the silicon nitride film and a film thickness of the second silicon oxide film, includes the steps of stacking the silicon nitride film and the second silicon oxide film to satisfy d2<d3, and forming the contact hole to have a tapered shape free of constrictions by collectively wet-etching the first silicon oxide film, the silicon nitride film and the second silicon oxide film.

(8) In a manufacturing method for fabrication of the display device according to the invention, which is based on, for example, the construction mentioned above in Example (7), letting θ1, θ2 and θ3 denote, respectively, a taper angle of the first silicon oxide film, a taper angle of the silicon nitride film and a taper angle of the second silicon oxide film, the contact hole is formed to satisfy the relationships $\theta2<\theta1<90°$ and $\theta2<\theta3<90°$.

(9) In a manufacturing method for fabrication of the display device according to the invention, which is based on, for example, the construction mentioned above in Examples 7 or 8, letting Er1, Er2 and Er3 denote, respectively, an etching rate of the first silicon oxide film, an etching rate of the silicon nitride film and an etching rate of the second silicon oxide film, the etching rates are selected to satisfy the relationships $Er1<Er3$, $Er2<Er3$ and $Er2<Er1$.

(10) In a manufacturing method for fabrication of the display device according to the invention, which is based on, for example, the construction mentioned above in Examples 7 or 8, letting Er1, Er2 and Er3 denote, respectively, an etching rate of the first silicon oxide film, an etching rate of the silicon nitride film and an etching rate of the second silicon oxide film, the etching rates are selected to satisfy the relationships $Er1 \geq Er3$, $Er2<Er3$ and $Er2<Er1$.

It is to be noted that the invention is not limited to any of the above-mentioned constructions and can be modified in various ways without departing from the technical ideas of the invention.

DETAILED DESCRIPTION OF THE PREFERRED EMBODIMENTS

Embodiments of a display device according to the invention will be described below with reference to the accompanying drawings.

Embodiment 1

<<Equivalent Circuit of Entire Display Device>>

Figure 2A:
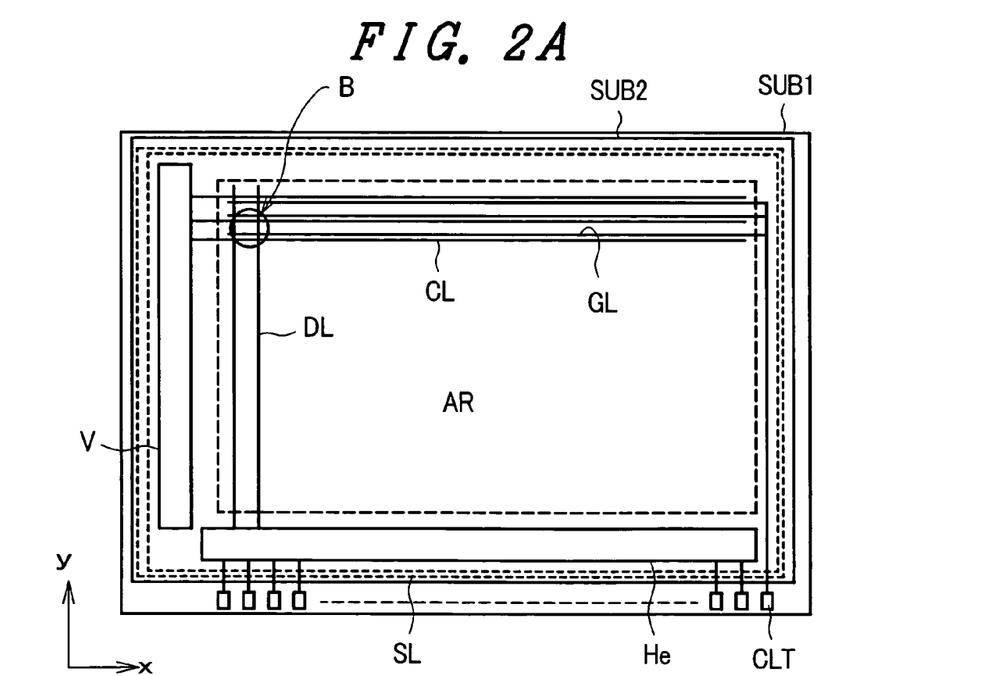
FIG. 2A and FIG. 2B are equivalent circuit diagrams showing one embodiment of the entire display device and a detailed view of a representative pixel therein, respectively, according to the invention.
Figure 2B:
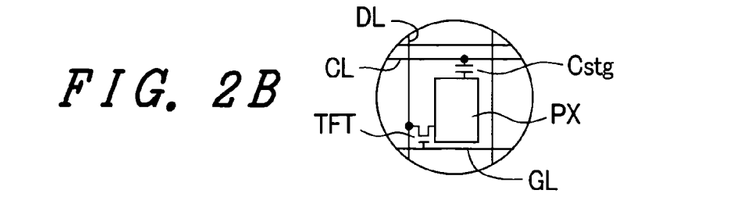

FIG. 2A and FIG. 2B are equivalent circuit diagrams showing an example of the first embodiment of a display device according to the invention, for example, a liquid crystal display device. FIG. 2A is an equivalent circuit diagram which the display device is depicted to correspond to an actual geometrical arrangement of the elements thereof. FIG. 2B is an enlargement of a part B of FIG. 2A.

In FIG. 2A, there are a pair of transparent substrates SUB1 and SUB2 which are disposed in opposition to each other with a liquid crystal interposed therebetween. The liquid crystal is sealed by a sealing material SL, which also serves to secure the transparent substrate SUB1 to the transparent substrate SUB2.

Gate signal lines (scanning signal lines) GL and drain signal lines (video signal lines) DL are formed on a liquid-crystal-side surface of the transparent substrate SUB1 surrounded by the sealing material SL. The gate signal lines GL are disposed to extend in the x direction and to be juxtaposed in the y direction, as viewed in FIG. 2A, while the drain signal lines DL are disposed to extend in the y direction and to be juxtaposed in the x direction, as viewed in FIG. 2A.

The individual areas which are surrounded by adjacent ones of the gate signal lines GL and adjacent ones of the drain signal lines DL constitute pixel areas, and a matrix-formed aggregation of these pixel areas constitutes a liquid crystal display part AR.

Capacitance signal lines CL, each of which is common to pixel areas juxtaposed in one row in the x direction, are formed to run through the pixel areas along the respective rows in the x direction. Each of the capacitance signal lines CL is connected to one of the electrodes of a capacitance element Cstg (to be described later) of a respective one of the pixel areas, and, for example, a predetermined level of voltage is applied to each of the capacitance signal lines CL.

As shown in FIG. 2B, a thin film transistor TFT and a pixel electrode PX are formed in each of the pixel areas. The thin film transistor TFT is operated by a scanning signal received from a gate signal line GL formed on one side of the pixel area, and the pixel electrode PX is supplied with a video signal received from a drain signal line DL formed on another side of the pixel area, via the thin film transistor TFT. The capacitance element Cstg is connected between the pixel electrode PX and the capacitance signal line CL. This capacitance element Cstg is provided for the purpose of storing a video signal, which is supplied to the pixel electrode PX, for a comparatively long time.

The thin film transistor TFT has a semiconductor layer made of, for example, polycrystalline Si (p-Si).

The pixel electrode PX is arranged so that an electric field is generated between the pixel electrode PX and a counter electrode CT (not shown), which is formed on a liquid-crystal-side surface of the transparent substrate SUB2 in common to each of the pixel areas, and the optical transmissivity of the liquid crystal is controlled by the electric field.

One end of each of the gate signal lines GL is formed to extend beyond the liquid crystal display part AR, and the extended end is connected to a scanning signal driver circuit V formed on the liquid-crystal-side surface of the transparent substrate SUB1. This scanning signal driver circuit V is formed of a multiplicity of MIS (Metal Insulator Semiconductor) transistors, interconnection layers which interconnect these transistors, and the like.

Similarly, one end of each of the drain signal lines DL is formed to extend beyond the liquid crystal display part AR, and the extended end is connected to a video signal driver circuit He, which is formed on the liquid-crystal-side surface of the transparent substrate SUB1. This video signal driver circuit He is also formed of a multiplicity of MIS transistors, interconnection layers which interconnect these transistors, and the like.

Each of the MIS transistors which constitute the scanning signal driver circuit V and the video signal driver circuit. He has a semiconductor layer formed of a polycrystalline layer similar to the semiconductor layer of the thin film transistor TFT in the respective pixel regions. Accordingly, it is common practice to form the MIS transistors in parallel with the formation of the thin film transistors TFT.

The capacitance signal lines CL, each of which is common to the pixel areas juxtaposed in one row in the x direction, are connected to a common connection line, for example, at their right-hand ends, as viewed in FIG. 2A. The connection line is formed to extend beyond the sealing material SL, and it constitutes a terminal CLT at its extended end.

Each one of the gate signal lines GL is sequentially selected by a scanning signal from the vertical scanning driver circuit V. In addition, a video signal is supplied to each of the drain signal lines DL by the video signal driver circuit He in synchronism with the timing of selection of each one of the gate signal lines GL.

<<Construction of Pixel>>

Figure 1:
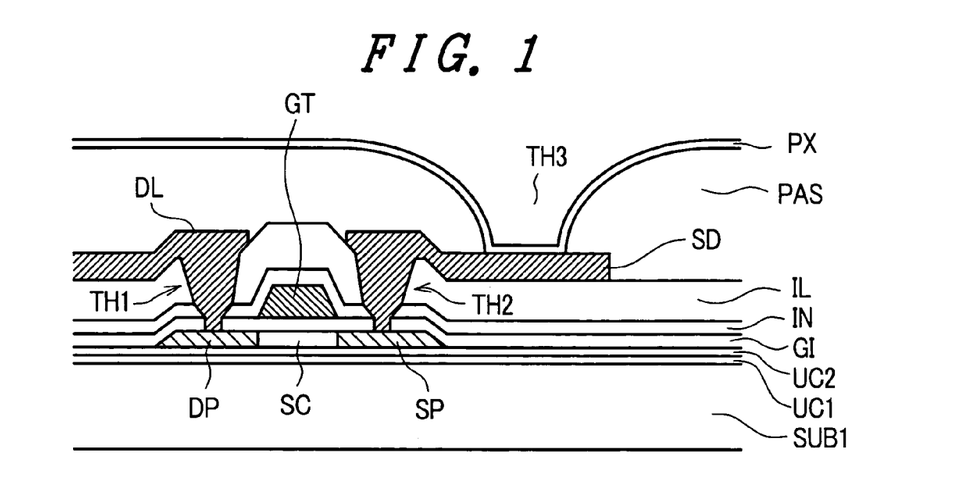
FIG. 1 is a diagram showing one embodiment of the construction of a thin film transistor and neighboring portions in a display device according to the invention, and is a cross-sectional view taken along line I—I of FIG. 3.
Figure 3:
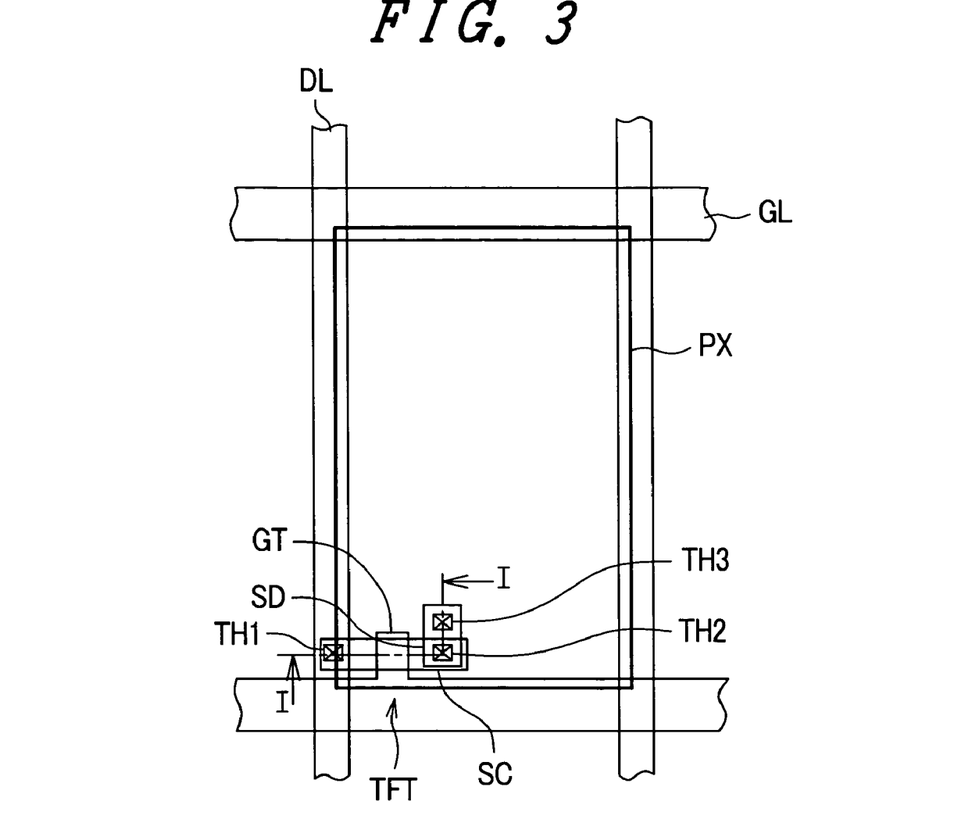
FIG. 3 is a plan view showing one example of one of the pixels of the display device according to the invention.

FIG. 3 is a plan view showing one example of one of the pixels in the pixel area, and FIG. 1 is a cross-sectional view taken along line I—I of FIG. 3.

As shown in FIG. 1, a structure in which a first undercoat layer UC1 made of silicone nitride film and a second undercoat layer UC2 made of silicon oxide film are stacked in the named order is formed on the liquid-crystal-side surface of the transparent substrate SUB1 by, for example, a plasma CVD method. These undercoat layers UC1 and UC2 serve as a film for preventing impurities from penetrating the thin film transistors TFT (to be described later) from the transparent substrate SUB1.

A semiconductor layer SC is formed on the upper surface of the second undercoat layer UC2 in a portion of the periphery of each of the pixel areas, for example, in the bottom left portion, as viewed in FIG. 3. This semiconductor layer SC is the semiconductor layer of the thin film transistor TFT, and it is formed of, for example, a polysilicon layer. This polysilicon layer is formed, for example, by crystallizing an amorphous silicon layer by laser annealing.

A first insulating layer GI made of, for example, a silicon nitride film is formed to cover the semiconductor layer SC on the surface of the transparent substrate SUB1. This first insulating layer GI has the function of a gate insulating film of the thin film transistor TFT. During manufacture, after the formation of the first insulating layer GI, a low concentration of, for example, phosphorus (P) is implanted into the semiconductor layer SC through the first insulating layer GI, whereby the semiconductor layer SC is formed into a low-concentration n-type semiconductor layer.

As shown in FIGS. 1 and 3, a gate signal line GL is formed on the surface of the first insulating layer GI, and this gate signal line GL has an extended portion formed to traverse the approximate center of the semiconductor layer SC. This extended portion functions as a gate electrode GT of the thin film transistor TFT. The gate signal line GL and the gate electrode GT are formed from a metal layer, such as MoW. After the deposition of the metal layer, the metal layer is formed into the gate signal line GL and the gate electrode GT by being patterned by selective etching using a photolithography technique.

During manufacture, after the formation of the gate signal line GL and the gate electrode GT, the process of implanting a high concentration of, for example, boron (B), by using the gate signal line GL and the gate electrode GT as a mask, is carried out. This process is intended to form the semiconductor layer SC, except for a region immediately below the gate electrode GT, into a high-concentration p-type region. In this manner, a drain region DP and a source region SP of the thin film transistor TFT are respectively formed in the semiconductor layer SC on the opposite sides of the gate electrode GT.

A second insulating layer IN made of, for example, silicon nitride film and a third insulating layer IL made of, for example, silicon oxide film are formed to cover the gate signal line GL and the gate electrode GT on the surface of the first insulating layer GI. These insulating layers IN and IL are formed by, for example, a plasma CVD method, and the second insulating layer IN is formed to a thickness of 50–200 nm, for example, 50 nm, while the third insulating layer IL is formed to a thickness of 400–500 nm. The second insulating layer IN is formed by a plasma CVD method at not higher than 400° C., and it is deposited under the deposition condition that there are no absorption edges in the visible region, and the amount of hydrogen contained in the layer IN is 2E21 to 2E22 atoms/cm$^3$. It is to be noted that during manufacture, after the formation of these insulating layers IN and IL, about 1 hour of heat treatment is performed at a temperature of 400 to 500° C., for example, 400° C., thereby performing activation of the impurities in the semiconductor layer SC and hydrogen termination thereof at the same time.

Then, the drain signal line DL is formed on the surface of the third insulating layer IL, and a portion of the drain signal line DL is connected to the drain region DP of the thin film transistor TFT through a contact hole TH1 that is formed to extend through the third insulating layer IL, the underlying second insulating layer IN, and the further underlying first insulating layer GI. Accordingly, the connection portion of the drain signal line DL that is connected to the drain region DP also serves as the drain electrode of the thin film transistor TFT.

A source electrode SD which is formed at the same time that the drain signal line DL is formed and which is connected to the source region SP of the thin film transistor TFT is formed on the surface of the third insulating layer IL. In this case as well, the source electrode SD is connected to the source region SP of the thin film transistor TFT through a contact hole TH2 formed to extend through the third insulating layer IL, the underlying second insulating layer IN, and the further underlying first insulating layer GI. This source electrode SD is electrically connected to the pixel electrode PX, which will be described later.

Figure 4:
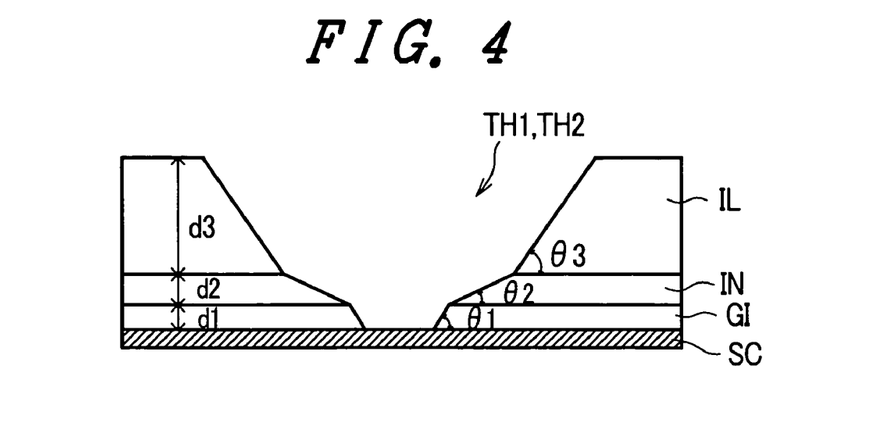
FIG. 4 is a cross-sectional view showing a contact hole formed in a thin film transistor of the display device according to the invention.

Each of the contact holes TH1 and TH2 has the cross-sectional shape shown in FIG. 4. In the first insulating layer GI, each of the contact holes TH1 and TH2 has a sidewall formed to make an angle (taper angle) of $\theta1$ (<90°) with the surface of the semiconductor layer SC; in the second insulating layer IN, each of the contact holes TH1 and TH2 has a sidewall formed to make an angle (taper angle) of $\theta2$ (<90°) with the surface of the first insulating layer GI; and in the third insulating layer IL, each of the contact holes TH1 and TH2 has a sidewall formed to make an angle (taper angle) of $\theta3$ (<90°) with the surface of the second insulating layer IN. These angles are selected to satisfy the relationships of $\theta2<\theta1<90°$ and $\theta2<\theta3<90°$.

In addition, letting d1, d2 and d3 denote, respectively, the film thickness of the first insulating layer GI, the film thickness of the second insulating layer IN and the film thickness of the third insulating layer IL, these film thicknesses satisfy the relationship of d2<d1<d3, at least d2<d3.

The formation of the contact holes TH1 and TH2 is performed by wet etching using buffered hydrofluoric acid (BHF). At this time, the silicon oxide film which forms the third insulating layer IL and the first insulating layer GI is etched at an etching rate of 10–30 nm/s. The silicon nitride film which forms the second insulating layer IN is formed by a plasma CVD method at not higher than 400° C., as mentioned above, and it is deposited under the deposition condition that there are no absorption edges in the visible region, and the amount of hydrogen contained in the silicon nitride film is 2E21 to 2E22 atoms/cm$^3$. This second insulating layer IN can be etched at a practical rate, and its etching rate is 3–10 nm/s.

Figure 5:
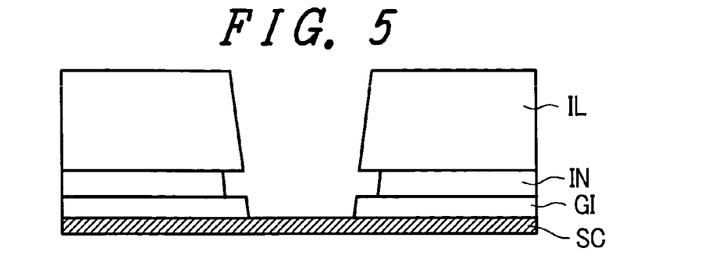
FIG. 5 is a cross-sectional view showing one example of a contact hole formed in a thin film transistor of a display device to which the invention is not applied.

Incidentally, when the contact holes TH1 and TH2 are to be formed by dry etching, the following disadvantages arise. Namely, in the silicon oxide film forming the third insulating layer IL and the first insulating layer GI, since etching proceeds under ion irradiation, dry etching in a so-called RIE mode becomes necessary, so that the taper angle of the sidewall of the third insulating layer IL becomes 90–80°. In addition, although a PFC gas, such as CF$_4$, is used as a gas for etching, the wall surfaces of the silicon nitride film forming the second insulating layer IN are etched inwardly to a great extent with respect to the wall surfaces of the first insulating layer GI and the third insulating layer IL, as shown in FIG. 5, so that a so-called undercut (which is a phenomenon herein called "constriction") easily occurs. This is because the silicon nitride film has the nature of being etchable even without ion irradiation. Furthermore, when the first insulating layer GI underlying the second insulating layer IN is to be etched, highly selective drying etching becomes necessary to the underlying semiconductor layer SC.

A protective layer PAS made of, for example, an organic material is formed to cover the drain signal line DL and the source electrode SD on the surface of the transparent substrate SUB1 on which the drain signal line DL and the source electrode SD are formed in the above-described manner, as shown in FIG. 1. The reason why an organic material is used for the protective layer PAS is to lower the dielectric constant of the protective layer PAS itself and reduce the parasitic capacitance which occurs between the pixel electrode PX (to be described later) formed on the upper surface of the protective layer PAS and the drain signal line DL formed under the protective layer PAS. A contact hole TH3 is formed in the protective layer PAS by exposure development, and a portion of the source electrode SD is exposed in the contact hole TH3.

The pixel electrode PX is formed on the upper surface of the protective layer PAS. The pixel electrode PX is made of an optically transmissive conductive layer of ITO (Indium Tin Oxide), ITZO (Indium Tin Zinc Oxide), IZO (Indium Zinc Oxide), SnO$_2$ (Tin Oxide), In$_2$O$_3$ (Indium Oxide) or the like, and it is formed to cover the greater part of the pixel. In this case, as long as electrical isolation can be established between the pixel electrode PX and each of the adjacent pixels, the periphery of the pixel electrode PX may also be formed to be superposed on the drain signal line DL or the gate signal line GL. This is because the protective layer PAS interposed between the pixel electrode PX and the drain signal line DL and the gate signal line GL is made of a material of low dielectric constant.

In the liquid crystal display device constructed in this manner, the contact holes TH1 and TH2 of the thin film transistor TFT are formed to have smooth taper angles free of so-called constrictions.

In this construction in particular, the contact holes TH1 and TH2 are formed to extend through the structure in which the silicone oxide film, the silicon nitride film and the silicon oxide film are stacked in the named order, whereby, for example, damage due to the difference between their etching rates can be avoided.

In the first embodiment of the invention, when the contact holes TH1 and TH2 are to be collectively wet-etched to extend through at least three layers, which include a first silicon oxide film, a silicon nitride film stacked on the first silicon oxide film, and a second oxide film stacked on the silicon nitride film, the contact holes TH1 and TH2, each having a tapered shape free of constrictions, can be formed by collectively wet-etching the silicon nitride film and the second silicon oxide film under the film-thickness condition of d2<d3, where d2 indicates the film thickness of the silicon nitride film and d3 indicates the film thickness of the second silicon oxide film.

As described above with reference to FIG. 5, in the case where a contact hole is formed not by wet etching but by dry etching, the silicon nitride film is formed to recede from the first and second silicon oxide films which, respectively, underlies and overlies the silicon nitride film. This receding shape is one example of what is herein called a constricted shape.

As shown in FIG. 2 of Patent Document 1, when an interlayer insulating layer made of a structure in which a silicon oxide film, a silicon nitride film and a silicon oxide film are stacked in the named order is to be collectively wet-etched, if wet-etching is performed under the condition that the film thickness of the silicon nitride film is larger than the film thickness of the overlying silicon oxide film, i.e., under the film-thickness condition of d2>d3, as compared with the present invention, the sidewalls of the overlying silicon oxide film and the underlying silicon oxide film are partly depressed. In other words, the sidewall is formed to partly have a taper angle exceeding 90°. This is another example of the constricted shape mentioned in the present specification.

In general, in the case of wet etching, the etching rate of a silicon nitride film is smaller than the etching rate of a silicon oxide film (namely, the former etching rate is slow). Accordingly, letting Er1, Er2 and Er3 denote, respectively, the etching rate of the first silicon oxide film, the etching rate of the silicon nitride film and the etching rate of the second silicon oxide film, these etching rates are selected to satisfy the relationships of Er2<Er3 and Er2<Er1.

In the case where wet etching is performed under the film-thickness condition of d2>d3, since the silicon nitride film which has a slow etching rate has a large film thickness, the wet etching takes time. In addition, the first and second silicon oxide films that respectively underlie and overlie the silicon nitride film are overetched, so that the sidewall of the contact hole is formed in a constricted shape.

On the other hand, in according with the invention, since wet etching is performed under the film-thickness condition of d2<d3, the etching time of the silicon nitride film can be made short, whereby the first and second silicon oxide films that respectively underlie and overlie the silicon nitride film are prevented from being overetched and the contact holes TH1 and TH2, each having a tapered shape free of constrictions, can be formed.

In addition, from the difference between the etching rates, letting θ1, θ2 and θ3 denote, respectively, the taper angle of the first silicon oxide film, the taper angle of the silicon nitride film and the taper angle of the second silicon oxide film, these taper angles are selected to satisfy the relationships of θ2<θ1<90° and θ2<θ3<90°.

The relationship between the etching rates of the first and second silicon oxide films is more preferably Er1<Er3, so that ideal taper shapes can be realized, but Er1≧Er3 may also be preferable.

In the above description of the first embodiment, reference has been made to the contact holes TH1 and TH2 of the thin film transistor TFT formed in each of the pixel areas, but the invention can also be applied to contact holes of MIS transistors which are formed and incorporated in a peripheral circuit, for example, the scanning signal driver circuit V or the video signal driver circuit He.

This is because any of the MIS transistors, as described above, has approximately the same construction as the thin film transistor TFT formed in each of the pixel areas and is formed in parallel with the thin film transistor TFT. Namely, when the semiconductor layers SC and the like of the thin film transistors TFT are formed, the semiconductor layers of the MIS transistors are also formed, and when the first insulating layer GI is to be formed, the first insulating layer GI is formed to cover not only the area of the liquid crystal display part AR, but also the areas in which the scanning signal driver circuit V and the video signal driver circuit. He are respectively formed.

Embodiment 2

The thin film transistor TFT of the above-described embodiment is generally referred to as a top gate type, in which the gate electrode GT is formed on the top side of the semiconductor layer SC. However, in this second embodiment, a so-called bottom gate type, in which the gate electrode GT is formed on the bottom side of the semiconductor layer SC, can also be used as another construction of the thin film transistor TFT.

In this case, the above-described construction of Embodiment 1 can be applied to, for example, a contact hole in which a portion of a signal supply terminal of the gate signal line GL formed integrally with the gate electrode GT is exposed. This is because the contact hole of the signal supply terminal of the gate signal line GL can be formed to have the same construction as the contact holes TH1 and TH2 of the thin film transistor TFT mentioned above in the description of Embodiment 1.

Figure 6:
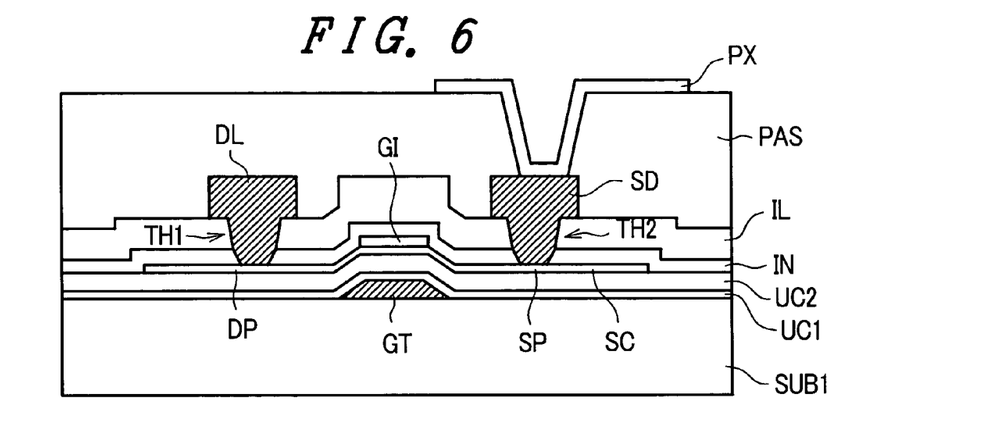
FIG. 6 is a cross-sectional view showing another embodiment of the construction of a thin film transistor and neighboring portions in a display device according to the invention.

FIG. 6 is a view corresponding to FIG. 1, showing a bottom gate type of thin film transistor, which is formed in each pixel of the liquid crystal display device. Namely, the gate electrode GT is formed on the liquid-crystal-side surface of the transparent substrate SUB1, and this gate electrode GT is formed integrally with the gate signal line GL.

A structure, in which the undercoat layer UC1 made of silicone nitride film and the undercoat layer UC2 made of silicon oxide film are stacked in the named order, is formed to cover the gate electrode GT and the gate signal line GL on the liquid-crystal-side surface of the transparent substrate SUB1 by, for example, a plasma CVD method. These undercoat layers UC1 and UC2 have the function of preventing impurities from penetrating the thin film transistors TFT (to be described later) from the transparent substrate SUB1, and also have the function of a gate insulating film of the thin film transistor TFT.

The semiconductor layer SC is formed on the upper surface of the second undercoat layer UC2 in an area in which the thin film transistor TFT is formed. This semiconductor layer SC is made of, for example, a polysilicon layer, and is formed to traverse the gate electrode GT. This polysilicon layer is formed, for example, by crystallizing an amorphous silicon layer by laser annealing.

The first insulating layer GI made of, for example, silicon oxide film is formed on the upper surface of the portion of the semiconductor layer SC which is traversed by the gate electrode GT. This first insulating layer GI is made to function as a mask for the doping of the semiconductor layer SC with impurities. Accordingly, the semiconductor layer SC can be formed as, for example, high-concentration n-type impurity layers in areas except an area immediately above the gate electrode GT.

The second insulating layer IN made of, for example, silicon nitride film and the third insulating layer IL made of, for example, silicon oxide film are formed to cover the semiconductor layer SC and the first insulating layer GI on the surface of the transparent substrate SUB1. These insulating layers IN and IL are formed by, for example, a plasma CVD method, and the second insulating layer IN is formed to a thickness of 50–200 nm, for example, 50 nm, while the third insulating layer IL is formed to a thickness of 400–500 nm. The second insulating layer IN is formed by a plasma CVD method at not higher than 400° C., and it is deposited under the deposition condition that there are no absorption edges in the visible region, and the amount of hydrogen contained in the layer IN is 2E21 to 2E22 atoms/cm$^3$. It is to be noted that during manufacture, after the formation of these insulating layers IN and IL, about 1 hour of heat treatment is performed at a temperature of 400 to 500° C., for example, 400° C., thereby performing activation of the impurities in the semiconductor layer SC and hydrogen termination thereof at the same time.

Then, the drain signal line DL is formed on the surface of the third insulating layer IL, and a portion of the drain signal line DL is connected to the drain region DP of the thin film transistor TFT through the contact hole TH1 that is formed to extend through the third insulating layer IL and the underlying second insulating layer IN. The source electrode SD, which is formed at the same time that the drain signal line DL is formed and which is connected to the source region SP of the thin film transistor TFT, is formed on the surface of the third insulating layer IL. In this case as well, the source electrode SD is connected to the source region SP of the thin film transistor TFT through the contact hole TH2 formed to extend through the third insulating layer IL and the underlying second insulating layer IN. This source electrode SD is electrically connected to the pixel electrode PX, which will be described later.

The protective layer PAS made of, for example, an organic material is formed to cover the drain signal line DL and the source electrode SD on the surface of the transparent substrate SUB1 on which the drain signal line DL and the source electrode SD are formed in the above-described manner. The pixel electrode PX is formed on the upper surface of the protective layer PAS. The pixel electrode PX is made of an optically transmissive conductive layer of ITO (Indium Tin Oxide) or the like, and it is formed to cover the greater part of the pixel.

Figure 7:
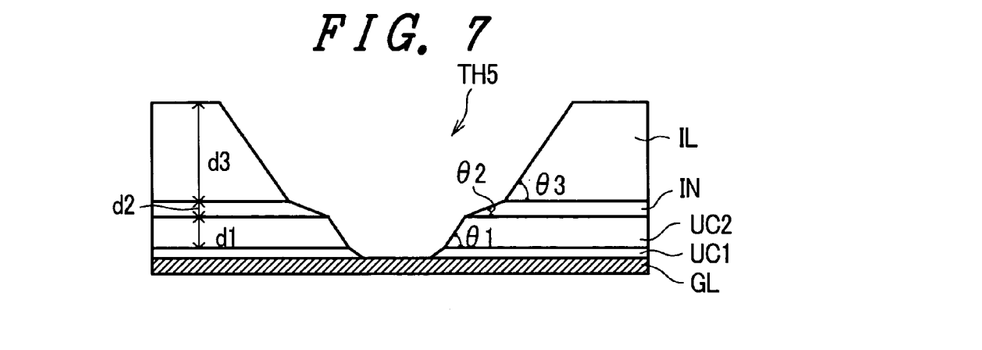
FIG. 7 is a cross-sectional view showing one example of a contact hole which is formed at a signal supply terminal of a gate signal line when the thin film transistor shown in FIG. 6 is formed.

In the liquid crystal display device having the thin film transistor TFT constructed in the above-described manner, a contact hole in which a portion of a signal supply terminal of the gate signal line GL is exposed is formed, as shown in FIG. 7. Namely, the first undercoat layer UC1, the second undercoat layer UC2, the second insulating layer IN, and the third insulating layer IL are stacked in the named order on the upper surface of the gate signal line GL, and a contact hole TH5 having a sidewall with a smooth slope is formed to extend through the stacked layers. This contact hole TH5 is formed at the same time as, for example, the thin film transistor TFT, and FIG. 7 shows the construction of the contact hole TH5 and a manufacturing method therefor.

The contact hole TH5 has the cross-sectional shape shown in FIG. 7. In the stacked second undercoat layer UC2, the contact hole TH5 has a sidewall formed to make an angle (taper angle) of $\theta1$ (<90°) with the surface of the first undercoat layer UC1; in the second insulating layer IN, the contact hole TH5 has a sidewall formed to make an angle (taper angle) of $\theta2$ (<90°) with the surface of the first insulating layer GI; and in the third insulating layer IL, the contact hole TH5 has a sidewall formed to make an angle (taper angle) of $\theta3$ (<90°) with the surface of the second insulating layer IN. These angles are selected to satisfy the relationships of $\theta2<\theta1<90°$ and $\theta2<\theta3<90°$.

In addition, letting d1, d2 and d3 denote, respectively, the film thickness of the silicon oxide film of the second undercoat layer UC2, the film thickness of the second insulating layer IN and the film thickness of the third insulating layer IL, these film thicknesses satisfy the relationship of $d2<d1<d3$, at least $d2<d3$.

The formation of the contact hole TH5 is performed, for example, by wet etching using buffered hydrofluoric acid (BHF). At this time, the silicon oxide film forming the third insulating layer IL and the second undercoat layer UC2 is etched at an etching rate of 10–30 nm/s. The silicon nitride film forming the second insulating layer IN is formed by a plasma CVD method at not higher than 400° C., as mentioned above, and it is deposited under the deposition condition that there are no absorption edges in the visible region, and the amount of hydrogen contained in the silicon nitride film is 2E21 to 2E22 atoms/cm³. This second insulating layer IN can be etched at a practical rate, and its etching rate is 3–10 nm/s.

Figure 8:
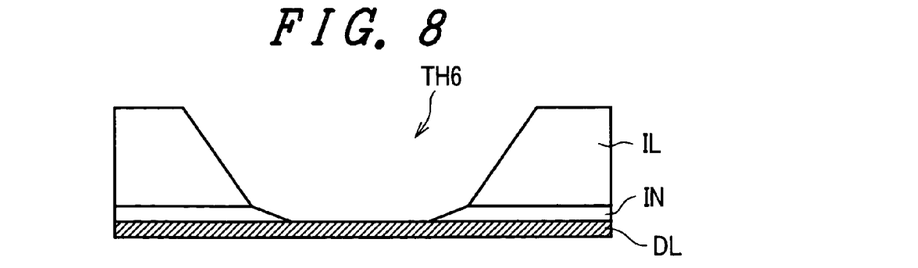
FIG. 8 is a cross-sectional view showing one example of a contact hole which is formed at a signal supply terminal of a drain signal line when the thin film transistor shown in FIG. 6 is formed.

FIG. 8 shows a cross section of a contact hole TH6 in which a portion of the signal supply terminal of the drain signal line DL is exposed. In this case as well, the sidewall of the contact hole TH6 is formed to have a smooth slope.

In the above description of each of the embodiments, reference has been made to a liquid crystal display device. It goes without saying, however, that the invention can also be applied to other display devices, such as organic EL (Electro Luminescence) display devices.

For example, in the case of an organic EL display device, one electrode, a luminescent material layer and the other electrode are stacked in each of its pixels, and when a current is made to flow in the luminescent material layer, the corresponding one of the pixels emits light according to the value of the current. Each of the pixels is provided with a thin film transistor for controlling its light emission according to a video signal.

In this type of display device as well, there is a case where contact holes are formed in a structure in which a silicon oxide film, a silicon nitride film and a silicon oxide film are stacked in the named order in its pixels or peripheral circuits (for example, a driver circuit).

The above-described embodiments may be used independently or in combination so that the advantages of the respective embodiments can be achieved independently or in combination.

As is apparent from the foregoing description, in accordance with the display device according to the invention, when a contact hole is formed in a structure in which a silicon oxide film, a silicon nitride film and a silicon oxide film are stacked in the named order, the taper of the sidewall of the contact hole can be formed in an ideal shape.

What is claimed is:

1. A display device comprising: a first silicon oxide film; a silicon nitride film stacked on the first silicon oxide film; a second silicon oxide film stacked on the silicon nitride film; and a contact hole extended through at least three layers which include the first silicon oxide film, the silicon nitride film and the second silicon oxide film, wherein the first silicon oxide film is a gate insulating film of a thin film transistor, the silicon nitride film and the second silicon oxide film are interlayer insulating films, and the contact hole is formed over each of source and drain regions of the thin film transistor, wherein a side wall of the contact hole is constituted by the first silicon oxide film, the silicon nitride film and the second silicon oxide film, and wherein letting d2 and d3 denote, respectively, a film thickness of the silicon nitride film and a film thickness of the second silicon oxide film, the silicon nitride film and the second silicon oxide film are stacked to satisfy the relationship $d2<d3$ and the contact hole is formed to have a tapered shape free of constrictions.

2. A display device according to claim 1, wherein letting $\theta1$, $\theta2$ and $\theta3$ denote, respectively, a taper angle of the first silicon oxide film, a taper angle of the silicon nitride film and a taper angle of the second silicon oxide film, the contact hole is formed to satisfy the relationships $\theta2<\theta1<90°$ and $\theta2<\theta3<90°$.

3. A display device according to claim 1, wherein letting Er1, Er2 and Er3 denote, respectively, an etching rate of the first silicon oxide film, an etching rate of the silicon nitride film and an etching rate of the second silicon oxide film, the etching rates are selected to satisfy the relationships Er1<Er3, Er2<Er3 and Er2<Er1.

4. A display device according to claim 1, wherein letting Er1, Er2 and Er3 denote, respectively, an etching rate of the first silicon oxide film, an etching rate of the silicon nitride film and an etching rate of the second silicon oxide film, the etching rates are selected to satisfy the relationships Er1≧Er3, Er2<Er3 and Er2<Er1.

5. A display device according to claim 1, wherein the contact hole is formed by collectively wet-etching the first silicon oxide film, the silicon nitride film and the second silicon oxide film.

6. A device comprising: a first silicon oxide film; a silicon nitride film stacked on the first silicon oxide film; a second silicon oxide film stacked on the silicon nitride film; and a contact hole extended through at least three layers which include the first silicon oxide film, the silicon nitride film and the second silicon oxide film, wherein the first silicon oxide film is a gate insulating film of a thin film transistor, the silicon nitride film and the second silicon oxide film are interlayer insulating films, and the contact hole is formed over each of source and drain regions of the thin film transistor, wherein a side wall of the contact hole is constituted by the first silicon oxide film, the silicon nitride film and the second silicon oxide film, and wherein letting d2 and d3 denote, respectively, a film thickness of the silicon nitride film and a film thickness of the second silicon oxide film, the silicon nitride film and the second silicon oxide film are stacked to satisfy the relationship d2<d3 and the contact hole is formed to have a tapered shape free of constrictions.

7. A device according to claim 6, wherein letting θ1, θ2 and θ3 denote, respectively, a taper angle of the first silicon oxide film, a taper angle of the silicon nitride film and a taper angle of the second silicon oxide film, the contact hole is formed to satisfy the relationships θ2<θ1<90° and θ2<θ3<90°.

8. A device according to claim 6, wherein letting Er1, Er2 and Er3 denote, respectively, an etching rate of the first silicon oxide film, an etching rate of the silicon nitride film and an etching rate of the second silicon oxide film, the etching rates are selected to satisfy the relationships Er1<Er3, Er2<Er3 and Er2<Er1.

9. A device according to claim 6, wherein letting Er1, Er2 and Er3 denote, respectively, an etching rate of the first silicon oxide film, an etching rate of the silicon nitride film and an etching rate of the second silicon oxide film, the etching rates are selected to satisfy the relationships Er1≧Er3, Er2<Er3 and Er2<Er1.

10. A device according to claim 6, wherein the contact hole is formed by collectively wet-etching the first silicon oxide film, the silicon nitride film and the second silicon oxide film.

11. A manufacturing method for a display device which includes a first silicon oxide film, a silicon nitride film stacked on the first silicon oxide film, a second silicon oxide film stacked on the silicon nitride film, and a contact hole extended through at least three layers which include the first silicon oxide film, the silicon nitride film and the second silicon oxide film, wherein the first silicon oxide film is a gate insulating film of a thin film transistor, the silicon nitride film and the second silicon oxide film are interlayer insulating films, and the contact hole is formed over each of source and drain regions of the thin film transistor, wherein a side wall of the contact hole is constituted by the first silicon oxide film and the silicon nitride film and the second silicon oxide film and wherein, letting d2 and d3 denote, respectively, a film thickness of the silicon nitride film and a film thickness of the second silicon oxide film, the method includes the steps of stacking the silicon nitride film and the second silicon oxide film to satisfy the relationship d2<d3, and forming the contact hole to have a tapered shape free of constrictions.

12. A manufacturing method for the display device according to claim 11, wherein the step of forming the contact hole to have the tapered shape free of constrictions includes collectively wet etching the first silicon oxide film, the silicon nitride film and the second silicon oxide film.

13. A manufacturing method for the display device according to claim 6, wherein letting θ1, θ2 and θ3 denote, respectively, a taper angle of the first silicon oxide film, a taper angle of the silicon nitride film and a taper angle of the second silicon oxide film, the contact hole is formed to satisfy the relationships θ2<θ1<90° and θ2<θ3<90°.

14. A manufacturing method for the display device according to claim 6, wherein letting Er1, Er2 and Er3 denote, respectively, an etching rate of the first silicon oxide film, an etching rate of the silicon nitride film and an etching rate of the second silicon oxide film, the etching rates are selected to satisfy the relationships Er1<Er3, Er2<Er3 and Er2<Er1.

15. A manufacturing method for the display device according to claim 6, wherein letting Er1, Er2 and Er3 denote, respectively, an etching rate of the first silicon oxide film, an etching rate of the silicon nitride film and an etching rate of the second silicon oxide film, the etching rates are selected to satisfy the relationships Er1≧Er3, Er2<Er3 and Er2<Er1.

* * * * *